(12) United States Patent
Takahashi et al.

(10) Patent No.: US 6,523,157 B1
(45) Date of Patent: Feb. 18, 2003

(54) METHOD FOR DESIGNING INTEGRATED CIRCUIT DEVICE AND DATABASE FOR DESIGN OF INTEGRATED CIRCUIT DEVICE

(75) Inventors: Miwaka Takahashi, Kyoto (JP); Akira Motohara, Hyogo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/559,464

(22) Filed: Apr. 28, 2000

(30) Foreign Application Priority Data

Apr. 30, 1999 (JP) .......................................... 11-124126

(51) Int. Cl.$^7$ .............................................. G06F 17/50
(52) U.S. Cl. ................... 716/10; 716/2; 716/4
(58) Field of Search .................... 716/1, 2, 4, 5, 716/6, 7, 8, 9, 10, 11, 18, 3; 703/19

(56) References Cited

U.S. PATENT DOCUMENTS

| | | | |
|---|---|---|---|
| 5,808,917 A | 9/1998 | Chatterjee et al. | 364/578 |
| 5,884,088 A | 3/1999 | Kardach et al. | 395/750.06 |
| 5,915,232 A | 6/1999 | McMinn | 702/130 |
| 5,930,516 A | 7/1999 | Watts, Jr. et al. | 395/750.04 |
| 5,933,358 A | 8/1999 | Koh et al. | 364/578 |
| 5,940,779 A | 8/1999 | Gaitonde et al. | 702/60 |
| 6,038,381 A * | 3/2000 | Munch et al. | 716/1 |
| 6,195,787 B1 * | 2/2001 | Yokoyama | 716/8 |
| 6,237,132 B1 * | 5/2001 | Dean et al. | 716/18 |
| 6,249,898 B1 * | 6/2001 | Koh et al. | 716/4 |
| 6,275,968 B1 * | 8/2001 | Dean et al. | 716/2 |
| 6,324,679 B1 * | 11/2001 | Raghunathan et al. | 716/18 |

* cited by examiner

*Primary Examiner*—Leigh M. Garbowski
(74) *Attorney, Agent, or Firm*—McDermott, Will & Emery

(57) ABSTRACT

In an integrated circuit device, when a net having many toggle counts exists in a circuit including blocks each having function modules, the circuit is changed to an equivalent circuit where the net is included inside a block. In the circuit, when the toggle counts of a function module in a block are especially many, a plurality of parallel blocks is provided in place of the block. When a plurality of pins of a block can be exchanged without changing the output value although the internal toggle counts of the block changes, the input pins are exchanged so that the internal toggle counts are less. Objects to be connected via a net having many toggle counts are given priority to be placed closer to each other in the floor plan.

11 Claims, 15 Drawing Sheets

Toggle optimization design and database therefor

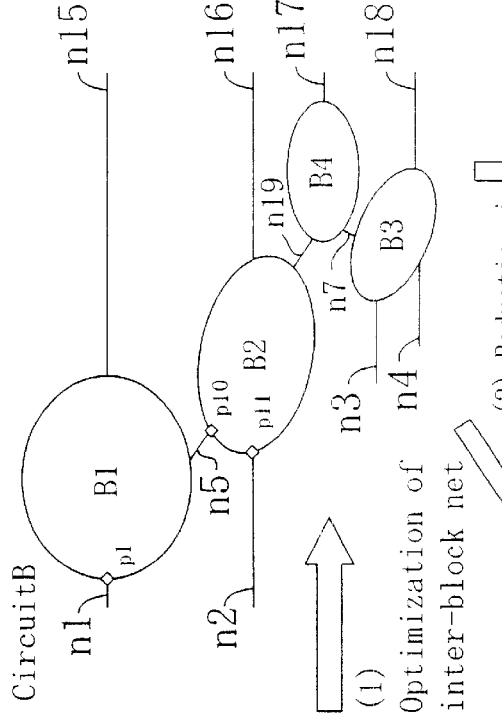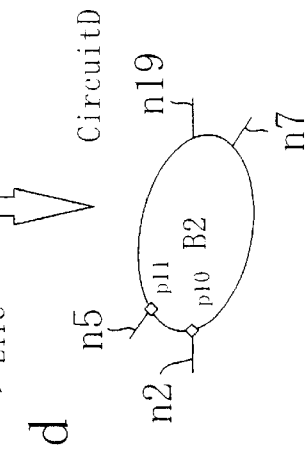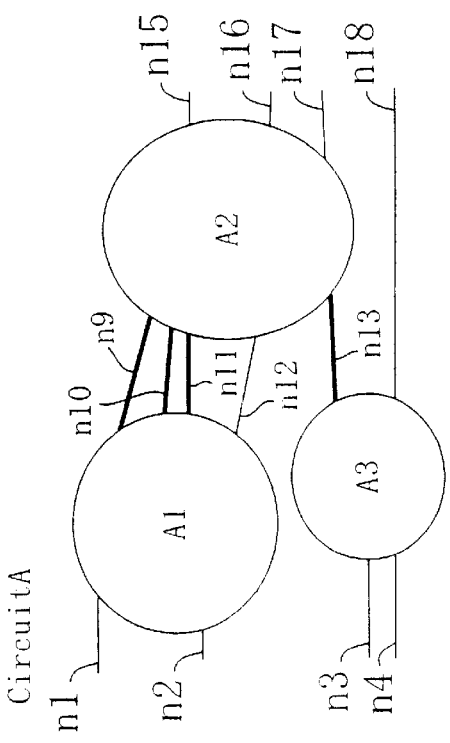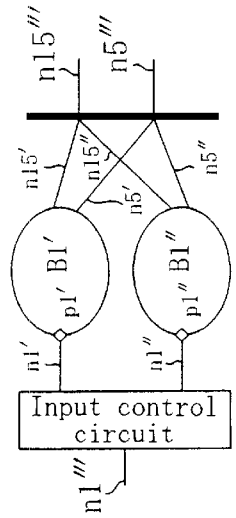
Fig. 4a Fig. 4b Fig. 4c Fig. 4d Fig. 4e

Fig. 6

| Net No. | Toggle counts | Inter-block net (NET) Circuit A | Inter-block net (NET) Circuit B |
|---|---|---|---|
| n1 | 40 | ANET1 | BNET1 |
| n2 | 40 | ANET2 | BNET2 |
| n3 | 20 | ANET3 | BNET3 |
| n4 | 20 | ANET4 | BNET4 |
| n5 | 10 | — | BNET5 |
| n6 | 80 | — | — |
| n7 | 40 | — | BNET6 |
| n8 | 20 | — | — |
| n9 | 400 | ANET5 | — |
| n10 | 300 | ANET6 | — |
| n11 | 10 | ANET7 | — |
| n12 | 10 | ANET8 | — |
| n13 | 80 | ANET9 | — |
| n14 | 10 | — | — |
| n15 | 40 | ANET10 | BNET7 |
| n16 | 40 | ANET11 | BNET8 |
| n17 | 40 | ANET12 | BNET9 |
| n18 | 20 | ANET13 | BNET10 |
| n19 | 10 | — | BNET11 |
| Cost Net | | 1060 | 310 |

Fig. 9

| Module | Toggle counts | | Primitive |
|---|---|---|---|
| | Average Aact | Peak Pact | |
| m1 | 50 | 100 | |
| m2 | 50 | 80 | |
| m3 | 50 | 120 | |
| m4 | 30 | 80 | |
| m5 | 30 | 80 | |
| m6 | 20 | 40 | |
| m7 | 40 | 120 | |
| m8 | 400 | 800 | i1 |
| m9 | 50 | 150 | |
| m10 | 50 | 130 | |
| m11 | 30 | 120 | |
| | average 55 | peak 400 | |

Fig. 10

| | Toggle counts | | |
|---|---|---|---|
| | Average AveAact | Peak PekPact | VC |
| B1 | 137 | 800 | m8 |
| B2 | 43 | 130 | m10 |
| B3 | 30 | 120 | m7 |
| B4 | 30 | 120 | m11 |
| | average 48 | peak 200 | B1 |

Fig. 12

|    | Input signal |     |     | Average toggle counts | Peak toggle counts | Peak toggle counts |
|----|------|------|------|---------|-----|--------|
| T1 | p20  | p21  | p22  |         |     |        |
| T1 | 300  | 400  | 10   | 200     | 400 | i1     |
| T2 | 400  | 300  | 10   | 400     | 800 | i1     |
| T3 | 100  | 100  | 100  | 100     | 100 | i1, i2 |

Fig. 13

T1
| Primitive | Toggle counts |
|-----------|---------------|
| i1        | 400           |
| i2        | 150           |
| i3        | 50            |
| average   | 200           |

| Net No. | Toggle counts | Object |
|---------|---------------|--------|
| n9 | 400 | m1, m8 |
| n10 | 300 | m2, m8 |
| n1 | 40 | input, m1 |
| ⋮ | | |

METHOD FOR DESIGNING INTEGRATED CIRCUIT DEVICE AND DATABASE FOR DESIGN OF INTEGRATED CIRCUIT DEVICE

BACKGROUND OF THE INVENTION

The present invention relates to toggle switch information optimization design for designing a high-performance LSI (large scale integrated circuit) through effective use of information on the toggle of circuits in the LSI.

In recent years, very deep sub-micron (VDSM) design has been established for formation of high-density high-integration LSIs by use of the fine semiconductor device formation process. This permits design of more multifunctional and reduced-area LSIs. To assist the VDSM design, technology and systems for accumulating and distributing function components to be placed in an LSI as reusable parts are on the way of establishment.

For example, a design technique is proposed where data for designing a block composed of a plurality of cells for implementing a certain function (for example, one called a function block) is prepared beforehand, and such data is utilized to design a desired system LSI composed of a combination of such blocks. According to this technique, since the structure for implementing the function of each function block has been determined, only design of wiring among function blocks and peripheral circuits is required in the design of the entire semiconductor device. In this way, substantial improvement in design efficiency is intended.

However, as semiconductor elements constituting circuits in the LSI are made smaller and integrated at higher density, there tend to arise problems such as increase in power consumption per unit area and increase in the probability that a local defect in a circuit will adversely affect the entire system, i.e., reduction in reliability. Solving these problems, therefore, becomes important.

In the conventional LSI design, the mainstream of the design is placing importance on the area of LSI that affects the cost and the performance that directly affects the performance. In the VDSM design, in consideration of the above problems, it has become necessary to reorient the stream of the design to place appropriate importance on the power consumption and the reliability in addition to the above aspects.

SUMMARY OF THE INVENTION

In view of the above-noted problems with the prior art technique, an object of the present invention is to provide a device and method for designing an integrated circuit device with high performance in view of power consumption and reliability by optimizing the toggle of circuits in an LSI, which toggle is understood as a factor affecting power consumption and causing a local defect.

The first method for designing an integrated circuit device according to the present invention includes the steps of: (a) generating a plurality of sub-circuits each including a plurality of components placed therein; (b) generating first nets for connecting components placed in a common one of the sub-circuits in the step (a) and second nets for connecting components placed in different ones of the sub-circuits in the step (a); (c) analyzing the toggles of the first nets and the second nets generated in the step (b) by simulating the behaviors of the components; and (d) changing the placement of the components and the connection relationship between the components and the nets based on the analysis results obtained from the step (c) so as to reduce the entire toggle of the first and second nets.

The above method permits circuit design reflecting the difference in power consumption depending on the toggle of the nets, and thus fabrication of an integrated circuit device with reduced power consumption.

In the first designing method, the step (d) includes placing two components connected via one of the second nets of which toggle counts are higher than a value obtained by multiplying an average of the toggle counts of all the nets by a given multiplier in the common sub-circuit. Thus, the placement of the components is modified so that the length of a net having many toggle count is reduced, in consideration that a net extending outside the sub-circuits tends to be long. In this way, design of an integrated circuit device with reduced power consumption as a whole is possible. In addition, the above placement results in reducing the toggle of a long net that tends to be degraded by frequent driving. This minimizes occurrence of local degradation of a specific net.

The second method for designing an integrated circuit device according to the present invention includes the steps of: (a) generating a plurality of sub-circuits each including a plurality of components placed therein; (b) generating first nets for connecting components placed in a common one of the sub-circuits generated in the step (a) and second nets for connecting components placed in different ones of the sub-circuits generated by the step (a); (c) analyzing the toggles of the components in the sub-circuits generated in the step (a) by simulating the behaviors of the components; and (d) changing the placement of the sub-circuits and the components based on the analysis results obtained from the step (c) so as to equalize the toggle counts of all the components.

The above method equalizes the toggle count of the components in the integrated circuit device, and thus minimizes local degradation in the integrated circuit device that may occur when the toggle of a specific component or a specific net connecting components is especially high.

In the second designing method, the step (d) comprises paralleling processing where a sub-circuit out of the plurality of sub-circuits of which toggle counts are equal to or more than a given value is divided into a plurality of parallel sub-circuits. By this processing, degradation in a specific sub-circuit is minimized.

In the second designing method, the paralleling processing is performed so that the increase rate of the area of the integrated circuit device after the paralleling processing does not exceed a given range. This makes it possible to minimize local degradation while minimizing disadvantageous increase in area.

Preferably, the second designing method further includes the step of simulating behaviors of components in the plurality of parallel sub-circuits generated in the step (d) and placing an input control circuit upstream of the plurality of parallel sub-circuits for switching the supply of a signal to the parallel sub-circuits so that the toggle counts of the parallel sub-circuits are equalized.

In addition to the above, more preferably, the second designing method further includes the step of simulating behaviors of components in the plurality of parallel sub-circuits generated in the step (d) and placing an output control circuit downstream of the plurality of parallel sub-circuits for collecting output signals from the parallel sub-circuits to output an output signal.

The third method for designing an integrated circuit device according to the present invention includes the steps of: (a) placing a plurality of components; (b) connecting the components placed in the step (a) via nets; (c) analyzing the toggles of the components placed in the step (a) by simulating the behaviors of the components; and (d) when it is found from the results of the analysis in the step (c) that there exists a component having the same number of input pins as the number of input signals received by the input pins and the input signals can be exchanged between the input pins without changing an output signal although the toggle of the component changes, changing the nets so that the input relationship providing a lower toggle is established.

The above method allows for reduction in the toggle of the components as long as signal transmission is not adversely affected, and thus design of an integrated circuit device with reduced power consumption.

The fourth method for designing an integrated circuit device according to the present invention includes the steps of: (a) placing a plurality of components; (b) connecting the components placed in the step (a) via nets; (c) analyzing the toggles of the components placed in the step (a) by simulating the behaviors of the components; and (d) when it is found from the results of the analysis in the step (c) that there exists a symmetric component having the same number of input pins as the number of input signals received by the input pins and the input signals can be exchanged between the input pins without changing an output signal although the toggles of the input pins are different, placing an input control circuit for equalizing the toggle counts of the input pins upstream of the component.

The above method minimizes local degradation in a specific portion of a component connected to an input pin having many toggle counts.

The fifth method for designing an integrated circuit device according to the present invention includes the steps of: (a) placing a plurality of components; (b) connecting the components placed in the step (a) via nets; (c) analyzing the toggle counts of the components placed in the step (a) by simulating the behaviors of the components; and (d) preparing a floor plan based on the results of the analysis in the step (c) so that two components connected via a net having more toggle counts are placed closer to each other.

The above method allows for preparation of a floor plan reflecting the toggles of the components and thus fabrication of an integrated circuit device with reduced power consumption.

In the fifth designing method, the floor plan in the step (d) is prepared so that the area of the integrated circuit device does not exceed a given range.

The database for design of an integrated circuit device according to the present invention includes: a first storage section for storing data of components required for construction of the integrated circuit device; and a second storage section for storing models for simulating behaviors of the components.

The database having the above construction allows for design of an integrated circuit device free from increase in power consumption and reduction in reliability due to local degradation by reflecting the variation in the toggle of the components constituting the integrated circuit device depending on the placement position of the components.

In the above database for design, preferably, the first storage section is arranged in a hierarchical structure of a plurality of layers according to the degree of abstraction, and the second storage section is arranged in a hierarchical structure of the same number of layers as the first storage section in correspondence with the respective hierarchical layers of the first storage section.

In the above database for design, the first storage section is a virtual core cluster including specification/behavior virtual cores for storing data in specification/behavior levels and register transfer virtual cores for storing data in a register transfer level required for satisfying the specifications/behavior indicated by the data stored by the specification/behavior virtual clusters.

BRIEF DESCRIPTION OF THE DRAWINGS

FIGS. 4(a) through 4(e) are views illustrating the concept of the toggle optimization design and the database for the design according to the present invention.

FIG. 6 shows in the form of a table the results of the toggle of nets obtained by simulating the behaviors of modules in EMBODIMENT 1 of the present invention.

FIG. 9 shows in the form of a table the average toggle counts and the peak toggle counts of VCs (modules) in EMBODIMENT 2 of the present invention.

FIG. 10 shows in the form of a table the average toggle counts and the peak toggle counts of blocks in EMBODIMENT 2 of the present invention.

FIG. 12 exemplifies in the form of a table the toggles of signals input into three input pins and the internal toggle counts of one module having the data shown in FIG. 9.

FIG. 13 shows in the form of a table the toggles of primitives in the module for one test bench shown in FIG. 12 in the first example of EMBODIMENT 3 of the present invention.

DESCRIPTION OF THE PREFERRED EMBODIMENTS

[Concept of VC, VCDS, and VCDB]

The term "virtual core (VC)" as used herein, which is a concept different from the "VC" as "virtual component" often used synonymously with "IP" (function block), is meant to be used for design of a system LSI constructed of one collective block and, in particular, refers to reusable data including hardware and software. The term "virtual core design system (VCDS)" as used herein is meant to refer to the entire system for optimizing hardware and software of a system LSI using the VC. The term "virtual core database (VCDB)" as used herein is meant to refer to a database used for the VC-using design.

[Outline of Construction of VCDS]

Figure 1:
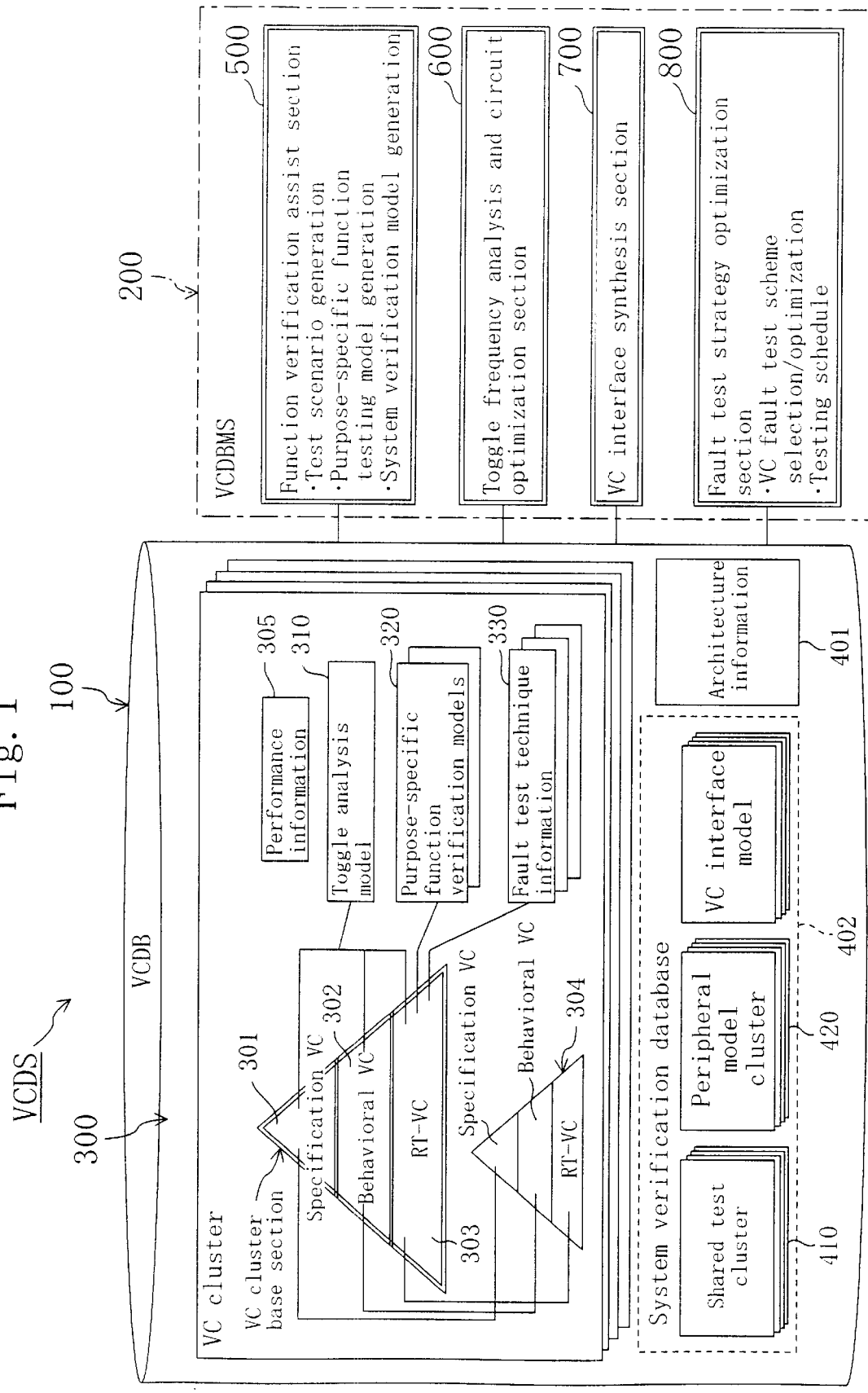
FIG. 1 is a conceptual view of the construction of a virtual core design system (VCDS) for system LSI design in embodiments of the present invention.

FIG. 1 is a conceptual view of a virtual core design system (VCDM) for design of a system LSI in an embodiment according to the present invention.

Referring to FIG. 1, the VCDS in this embodiment includes a virtual core database (VCDB) 100 for storing data for system design and a VCDB management system (VCDBMS) 200 that is a control system for performing optimization of the VCDB 100 and the like.

The VCDB 100 includes a VC cluster 300 as a collective of VCs, architecture information 401 for determining the structure of the VCs in the VC cluster 300, and a system verification database 402.

The VC cluster 300 includes a body section generally composed of a specification layer for VCs storing data described in the specification form (specification VCs 301), an behavioral layer for VCs storing data described in the behavioral form (behavioral VCs 302), and a function layer for VCs storing data described in a register transfer (RT) level in (RT-VCs 303). The VC cluster 300 also includes: a test cluster 304 that has parameterized test patterns and performs circuit simulation; and performance information 350 for evaluating the performance of the VCs by simulation and the like.

The performance information 350 includes performance indicators that are parameters such as the area and the speed, for example. With these performance indicators, considerably accurate calculation of a value is possible in the RT level, for example. In addition, if hardware implementation has been actually done in the RT level, the results can also be incorporated as an information indicator.

The VC cluster 300 further includes the following components linked to one or more VCs in the body section: a toggle analysis model 310 linked to the specification VCs 301 (specification layer), the behavioral VCs 302 (behavioral layer), and the RT-VCs 303 (function layer); a purpose-specific function verification models 320 linked to the RT-VCs 303 (function layer); and fault test technique information 330 linked to the RT-VCs 303 (function layer) including information on the type of test such as scanning and BIST available for the VCs, and the like.

The architecture information 401 includes information on how the respective VCs should actually be used. For example, if a certain task is to be implemented by software, the architecture information 401 includes various items of information required for the system LSI, such as "what processor should be used to execute the task", "What bus (interface) should be used", "how the power and clock supply scheme should be", "what test scheme should be used for logical synthesis", and "how about restrictions in the naming rules (restrictions on tools and rules for preventing overlap naming)".

The system verification database 402 serves as a data-base for verifying the function of an LSI obtained by combining VCs, and includes a shared test cluster 410, a peripheral model cluster 420, and a VC interface model.

The shared test cluster 410 and the test cluster 304 in the VC cluster 300 respectively include a test bench, a test scenario, a task, and a model. The test bench includes a system structure for test and a function model. The test scenario refers to a flow of verification in the system level, i.e., a system behavioral sequence. The task refers to a task for initializing a VC or executing a specific function. The model refers to a link to a simulation model, a VC model, or a peripheral simulation model to be used in the construction of the test bench. Concrete examples of the constructions of the test clusters will be described hereinafter.

The peripheral model cluster 420 includes models for peripherial of VCs used during system verification, such as models describing an external medium, an external memory, a transmission route in the case of a communication LCI, and a sensor. By combining the VCs with these peripheral models, the entire system can be verified smoothly. The VC interface model serves as a model for coupling respective VCs during system simulation.

The VCDBMS 200 performs registration with the VCDB 100, external retrieval from the VCDB 100, generation of instances, and other various types of processing described below. The registration includes, not only registering a new core, but also generating a new VC based on an existing VC, modifying the function of the VC, adding data to the VC, storing associated difference management information, and the like. The retrieval is done based on what type of information in which level of VC is desired.

The VCDBMS 200 includes: a function verification assist section 500 for generating test scenarios, purpose-specific function verification models (simulation models), system verification models (system simulation models), and the like; a toggle analysis and circuit optimization section 600; a VC interface synthesis section 700; and a fault test strategy optimization section 800 for selecting/optimizing a VC fault test scheme and planning a testing schedule.

Figure 2:
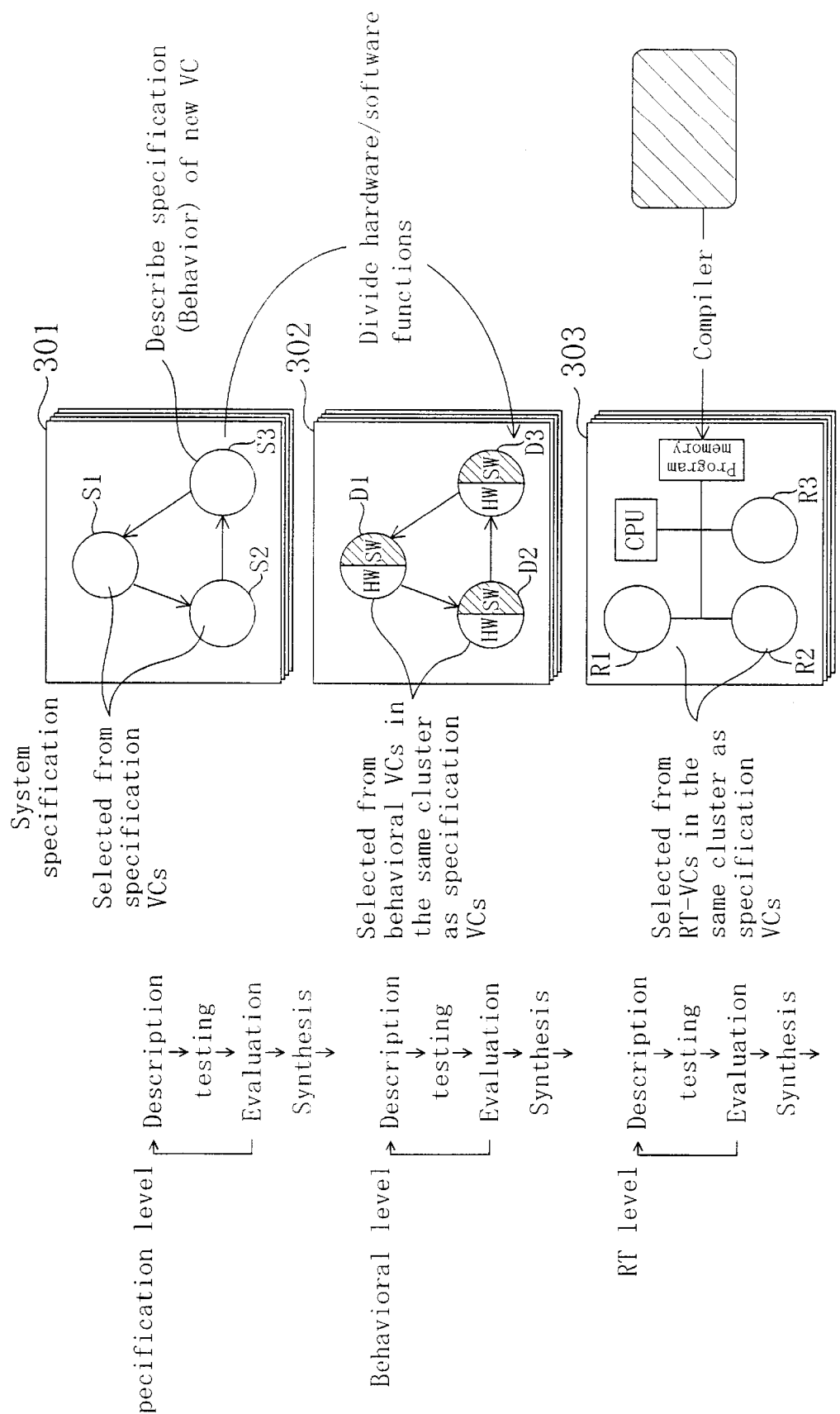
FIG. 2 is a view illustrating a basic task flow in the VCDS in the embodiments of the present invention.

FIG. 2 shows a basic design flow in the VCDS in this embodiment. As shown in FIG. 2, in all of the specification level, the behavioral level, and the RT level, VCs are generated, modified, or otherwise processed in the sequence of "description", "verification", "evaluation", and "synthesis". For example, in the specification level, existing specification VCs S1 and S2 are retrieved, or a new VC S3 is generated. In this occasion, data flows in the direction indicated by the arrows in the figure for description, verification, and evaluation of the data. The evaluation results are fed back. In the behavioral level, behavioral VCs D1, D2, and D3 respectively corresponding to the specification VCs S1, S2, and S3 are generated, each of which is functionally divided into hardware and software. In the RT level, RT-VCs R1, R2, and R3 respectively corresponding to the behavioral VCs D1, D2, and D3 are generated, together with a CPU, a memory, buses for connecting these VCs, and the like. Thus, in this level, the system becomes more concrete.

Each task is described by means of external input/output, a specification VC, state transfer, and the like. Each specification VC is described with a language or graphics capable of representing state transfer, logic, a truth table, and the like.

Thus, by arranging VCs in the respective hierarchical layers and managing these VCs collectively, a flexibly usable database can be provided, unlike the conventional function blocks.

Figure 3:
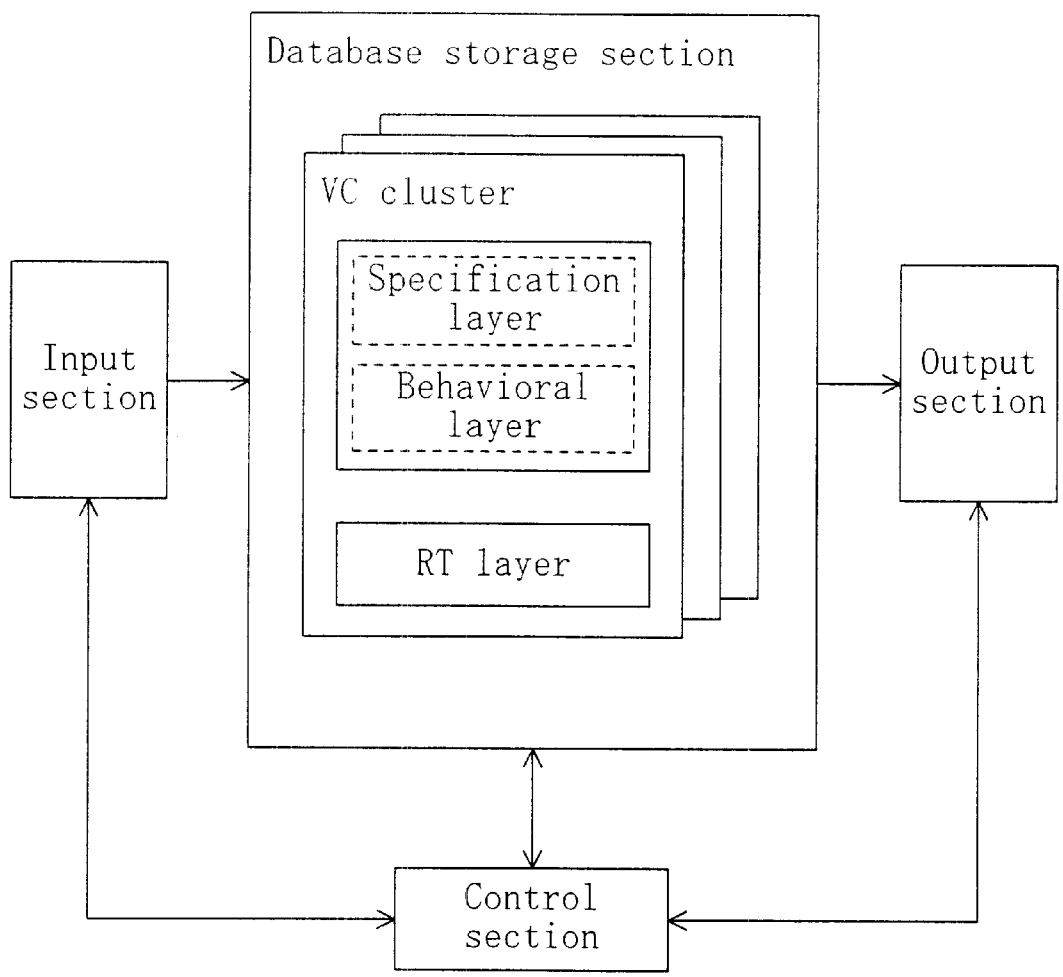
FIG. 3 is a block diagram of a functional portion of the system shown in FIG. 1.

FIG. 3 is a block diagram of functional part of the system shown in FIG. 1, showing an input section for supplying information to a database storage section where VC clusters are stored, an output section for receiving output information from the database storage section, and a control section for controlling the database storage section, the input section, and the output section. Each VC cluster includes a specification/behavior layer composed of a specification layer for generating specification VCs and an behavioral layer for generating behavioral VCs, and a RT layer for generating RT-VCs. The specification layer and the behavioral layer are put together in this case as the specification/behavior layer since they are not clearly distinguished from each other in some cases. The "behavior" as used herein refers to allocating one specification to software and hardware. In general, a plurality of behaviors exists for one specification. The "register transfer (RT)" as used herein refers to hardware implementation of the behavior. In general, a plurality of different methods exist for implementing one behavior depending on the parameter on which importance is placed, and the like. In other words, in general, a plurality of behavioral VCs exists for one specification VC, and a plurality of RT-VCs exists for one behavioral VC in a hierarchical manner. It should however be noted that the specification and the behavior as used herein both represent functional concepts and thus it may be difficult to distinguish one from the other. In such a case, it is possible to prepare a database for specification/behavior VCs. [Embodiments for toggle analysis and circuit optimization section]

FIGS. 4(a) through 4(e) illustrate the concept of toggle optimization design and a database for the design according to the present invention.

In the following embodiments, the term "(function) module" refers to a component constituting a circuit (object), the term "sub-module" refers to a component constituting the module, and the term "primitive" refers to a component constituting the sub-module.

Referring to FIG. 4(a), consider that a circuit A having blocks A1, A2, and A3 each including function modules is to be designed. If nets n9, n10, and n13 out of nets n9 through n13 interconnecting the blocks A1 and A2 or the blocks A2 and A3 have many toggle counts circuit A is changed to an equivalent circuit B as shown in FIG. 4(b) where these nets having many toggle counts are incorporated in blocks. This reduces the length of the interconnections having many toggle counts and thus permits reduction in power consumption and the like.

In the circuit B shown in FIG. 4(b), if the toggle of the function modules in a block B1 is particularly high, the block B1 is changed to two parallel blocks B1' and B1" as shown in FIG. 4(c) so as to improve the reliability. The entire area of the block B1 increases by providing two parallel blocks. Therefore, the circuit area and the reliability are in the trade-off relationship as shown in FIG. 4(d).

Further consider the case where, when two input pins p10 and p11 of the block B2 in the circuit B is exchanged, the internal toggle counts changes while the output value of the block remains unchanged. In such a case, the input pins p10 and p11 are exchanged so that the internal toggle counts reduces as shown in FIG. 4(e). Thus, with the reduction in internal toggle counts, the power consumption can be reduced.

As another case, VCs (objects) connected via a net having many toggle counts are given priority in the floor plan so as to be placed closer to each other.

Embodiment 1

Figure 5:
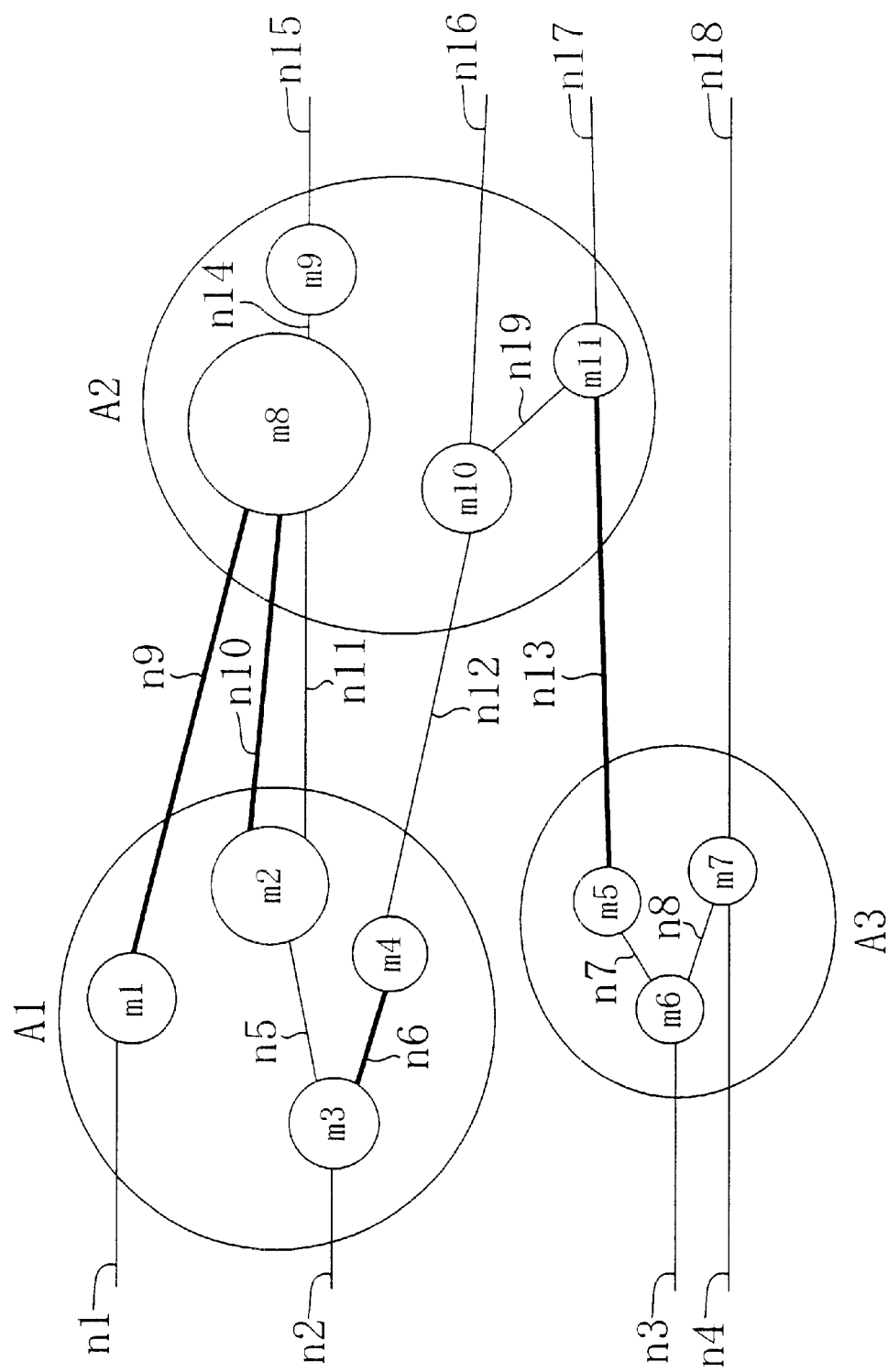
FIG. 5 is a block diagram illustrating in detail the insides of blocks A1, A2, and A3 shown in FIG. 4(a) in EMBODIMENT 1 of the present invention.

EMBODIMENT 1 is directed to inter-block net optimization. FIG. 5 is a block diagram illustrating in detail the insides of the blocks A1, A2, and A3 shown in FIG. 4(a).

The circuit A is designed as shown in FIG. 5. The block A1 includes modules m1, m2, m3, and m4 and nets n5 and n6. The block A2 includes modules m8, m9, m10, and m11 and nets n14 and n19. The block A3 includes modules m5, m6, and m7 and nets n7 and n8.

Assume that the modules m1 to m11 in this embodiment and subsequent embodiments are designed using VCs (specification VCs, behavioral VCs, and RT-VCs, for design) in the VC cluster stored in the VCDB 100 shown in FIG. 1.

The modules m1 to m11 are connected via the following nets. In the block A1, the modules m2 and m3 are connected via the net n5, and the modules m3 and m4 are connected via the net n6. Between the blocks A1 and A2, the modules m1 and m8 are connected via the net n9, the modules m2 and m8 are connected via the net n10 and also the net n11, and the modules m4 and m10 are connected via the net n12. Between the blocks A2 and A3, the modules m5 and m11 are connected via the net n13.

The modules are also externally connected as follows. The modules m1 and m3 are respectively connected with the nets n1 and n2. The module m6 is connected with the net n3. The module m7 is connected with the nets n4 and n18. The modules m9, m10, and m11 are respectively connected with the nets n15, n16, and n17.

Simulation is made for the modules m1 to m11 using VC design simulation models in the VCDB 100 to obtain the toggles of the respective nets n1 to n19. The resultant toggle data is as shown in FIG. 6. From this data it is found that the toggle is particularly high in the nets n9 and n10 and comparatively high in the nets n6 and n13.

Only the nets extending outside the blocks, i.e., the nets excluding the nets connecting modules inside the same block (inner-block nets), are selected as inter-block nets ANET1 to ANET13, and the sum of the toggles of the inter-block nets is calculated. This is done for the following reason. The length of an inter-block net tends to be larger than that of an inner-block net. If the toggle of a long inter-block net is high, the power consumption increases. Therefore, power consumption reduction processing is made based on the toggles of inter-block nets that are particularly influential on power consumption.

The sum of the toggles of the inter-block nets ANET1 to ANET13 is defined as a cost function Cost Net.

Cost Net(circuit)=activity(Net)

Figure 7:
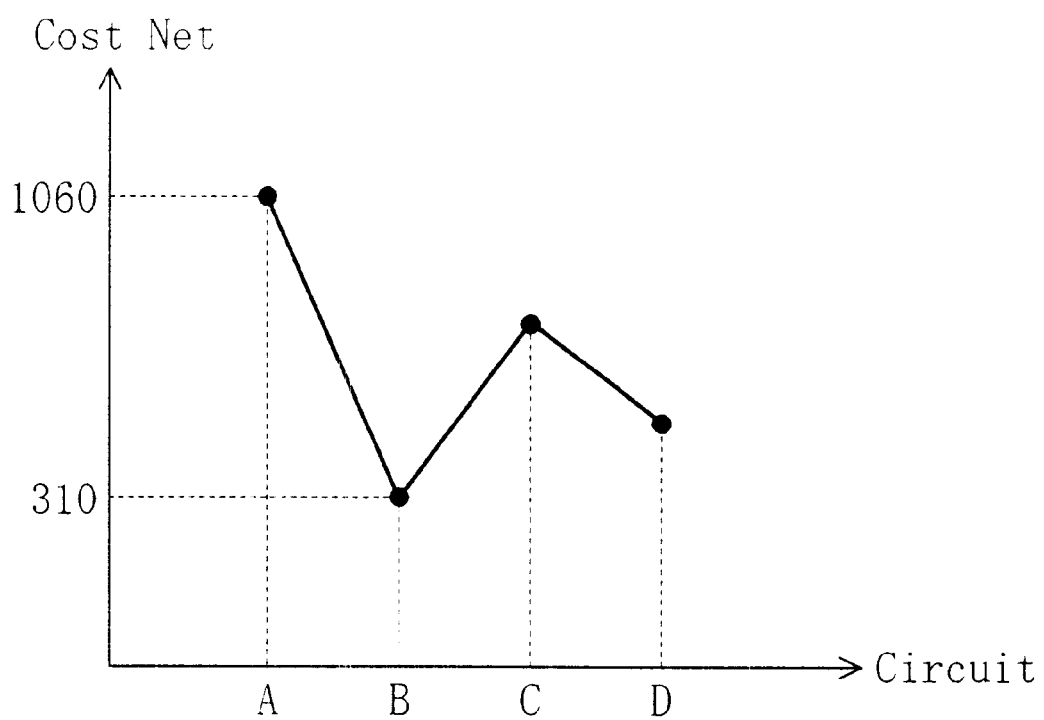
FIG. 7 is a graph showing the cost function of circuits with different block constructions obtained by re-designing the modules in EMBODIMENT 1 of the present invention.

The modules are re-designed so as to prepare circuits B, C, D, . . . that are different in the construction of blocks while maintaining the same I/O relationship as the circuit A. For the respective circuits prepared, the cost function Cost Net(circuit) is calculated, to obtain data as shown in FIG. 7. It is found from this data that Cost Net of the circuit B is minimum. Thus, processing for changing the circuit A to the circuit B is performed.

Figure 8:
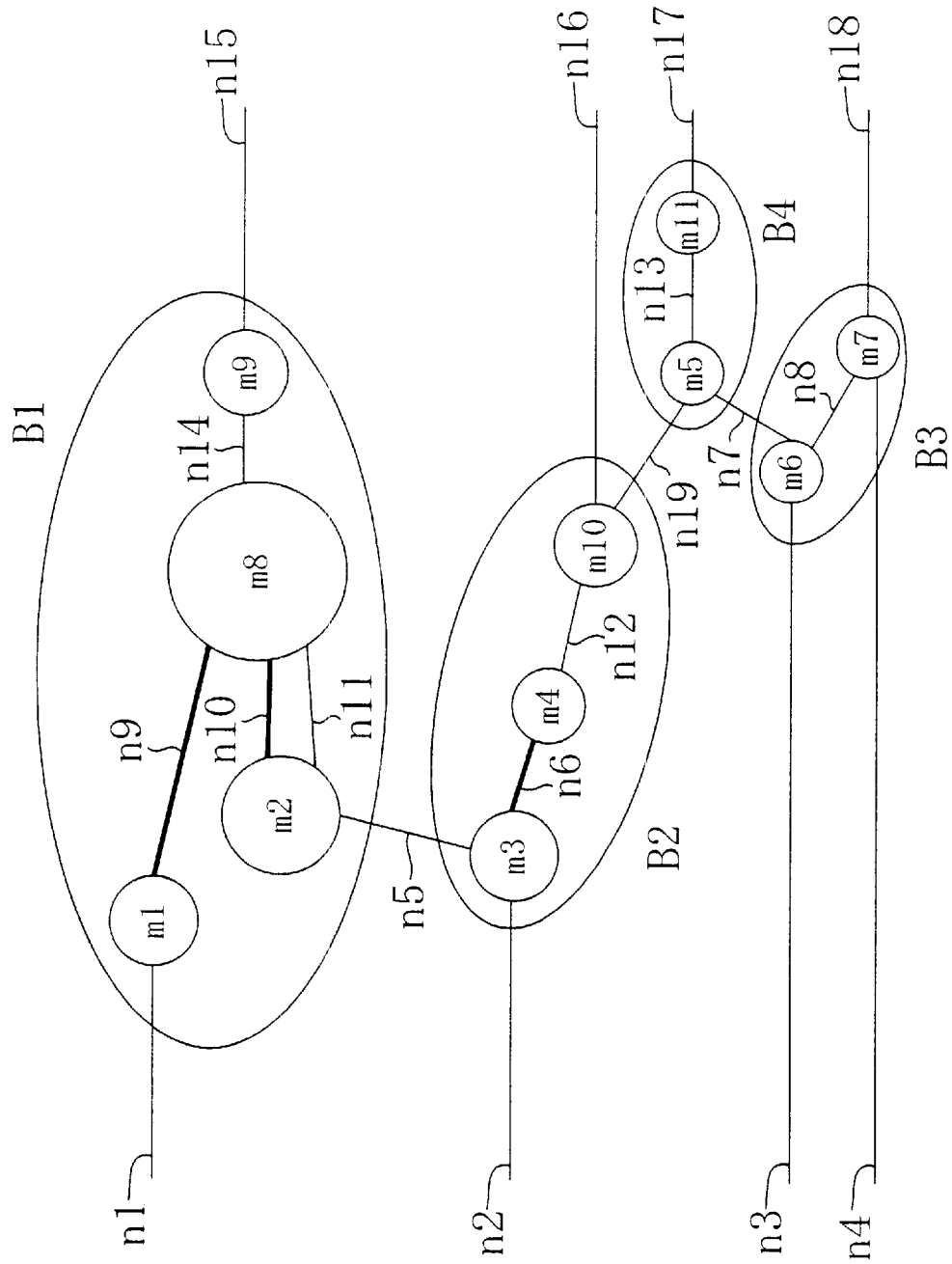
FIG. 8 is a block diagram of the construction of a circuit modified according to the results of toggle analysis in EMBODIMENT 1 of the present invention.

FIG. 8 is a block diagram illustrating the construction of the circuit B obtained as a result of the toggle analysis processing. Referring to FIG. 8, the blocks B1 through B4 in the circuit B include the following modules. The block B1 includes the modules m1, m2, and m8 and the nets n9, n10, and n11. The block B2 includes the modules m3, m4, and m10 and the nets n6 and n12. The block B3 includes the modules m5 and m11 and the net n13. The block B4 includes the modules m6 and m7 the net.

Of the nets n1 through n19, the nets n1, n2, n3, n4, n5, n7, n19, n15, n16, n17, and n18 extending externally from the.

modules m1, m3, m6, m7, m9, m10, m11, and m7, respectively, are inter-block nets as in the circuit A, denoted in this case as BNET1-BNET11, and BNET10. In other words, the I/O relationship of these nets with respect to the circuit B is the same as that with respect to the circuit A. The other nets mostly have been changed in the type, i.e., whether an inner-block net or an inter-block net.

Specifically, the nets n5, n7, and n19 that were inner-block nets in the circuit A have been changed to inter-block nets BNET5, BNET6, and BNET11. On the contrary, the nets n9, n10, n11, n12, and n13 that were inter-block nets in the circuit A have been changed to inner-block nets. FIG. 6 shovs the type of the nets in the circuit B as well as in the circuit A.

As a result, as is found from the toggle analysis data shown In FIG. 6, the nets n6, n9, n10, and n13 having particularly many toggle counts are now inner-block nets, and thus, as shown in FIG. 6, the value of Cost Net is significantly reduced from "1060" in the circuit A to "310" in the circuit B.

Thus, in this embodiment of the inter-block nets having a large wiring length in the circuit A. those having many toggle counts have been changed to inner-block nets in the circuit B. This reduces the wiring capacitance of the nets having many toggle counts, thereby allowing for reduction in power consumption. In addition, the following effect is obtained.

Frequent behavior of a net having a large wiring length implies that a gate driving the net also operates frequently. This is likely to degrade the gate and cause a local defect resulting in lowering the reliability of the entire integrated circuit device. In this embodiment, however, as shown in FIG. 8, the nets n5, n7, and n19 that have a few toggle counts are placed as inter-block nets having a large wiring length. This placement reduces the burden on the gates driving these nets, and thus permits design of an integrated circuit device with high reliability.

The degree of the toggle of a net as a basis for determining whether or not the net should be placed inside a block is determined in the following manner.

The first method is to place in a block a net having toggle counts equal to or more than a value obtained by multiplying the average toggle counts of all nets by a predetermined multiplier. For example, the average toggle counts of all the nets shown in FIG. 6 is 64.8. This average value is multiplied by 1.45 to obtain 93.8. Any pair of modules connected via a net having toggle counts equal to or more than 93.8 are placed in a common block. The above predetermined multiplier can be appropriately selected depending on the type of the integrated circuit device to be designed and the like.

The second method is to place pairs of modules connected via the nets having more toggle counts (for example, first to fourth many toggle counts) in common blocks.

The third method is to place in a block a net having toggle counts exceeding upwardly the range covered by a value obtained by multiplying the standard deviation of the toggle of nets by a predetermined multiplier. For example, the reference toggle counts can be "average+predetermined multiplier×standard deviation/2". Using the data shown in FIG. 6, the average value (average toggle counts) is 64.7 and the standard deviation is 101.3. When the predetermined multiplier is 2, the reference toggle counts are 64.7+2× 101.3/2=166.0. Any pair of modules connected via a net having toggle counts equal to or more than 166.0 are placed in a common block.

Alternatively, an inter-block net having a wiring length equal to or more than a predetermined length and modules connected via such an inter-block net may be placed in a common block.

Embodiment 2

This embodiment is directed to measures for reducing the inner-module toggle counts. In this embodiment, calculation of the average toggle counts and the peak toggle counts will be described as a method for generating a toggle analysis model.

Average Toggle Counts and Peak Toggle Counts

First, a method for generating the toggle analysis model 310 in the VCDB 100 will be outlined. Simulation is made using the test cluster 304 including test benches for function evaluations for the specification VCs 301, the behavioral VCs 302, and the RT-VCs 303. Based on the analysis results of the toggles of sub-modules or primitives constituting each VC (module), the toggle analysis model 310 is generated.

Figure 14:
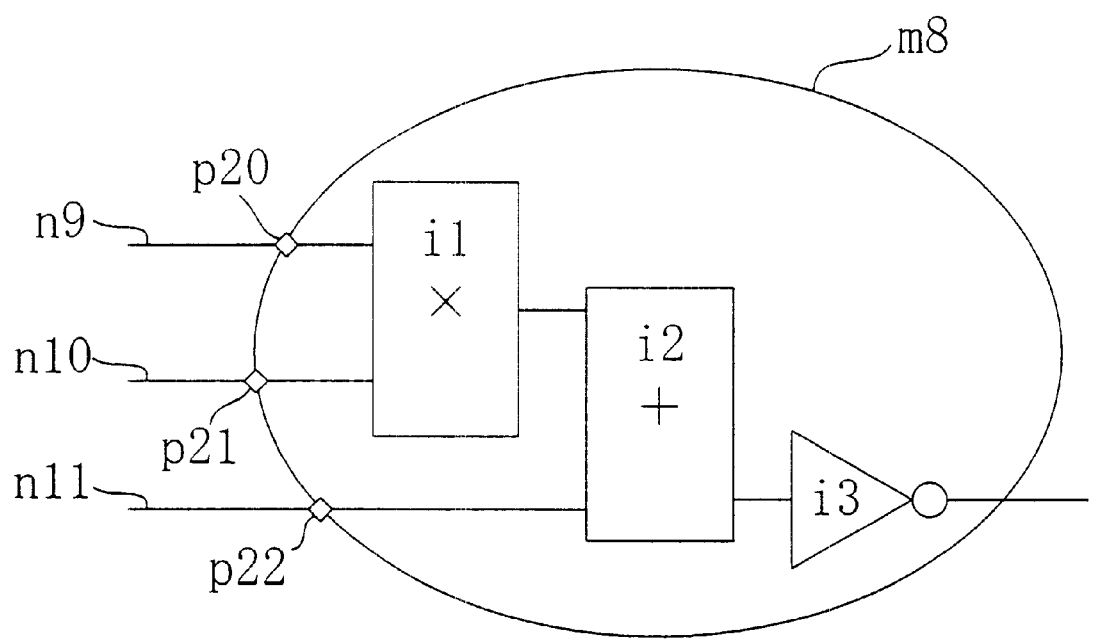
FIG. 14 is a block circuit diagram of an asymmetric construction of primitives in the module shown in FIG. 12.

For example, the toggle analysis model for the VC (module) m8 shown in FIG. 8 is as shown in FIG. 12. The procedure for generating this model will be outlined. Referring to FIG. 14, the VC (module) m8 includes primitives i1, i2, and i3 and input pins p20, p21, and p22. The toggle countss of the primitives i1, i2, and i3 in the VC (module) m8 are measured using the test bench T1 for function analysis of the VC (module) m8. The results are as shown in FIG. 13, for example. The average toggle counts of the primitives i1, i2 and i3 is determined by dividing the sum of the toggle counts of all the primitives by the number of primitives. In the case shown in FIG. 13, the average is 200. Based on these results, the toggle analysis model as results, the toggle analysis model as shown in FIG. 12 is obtained. FIG. 12 shows, for the simulation using the test bench T1: the toggles of the input pins p20, p21, and p22 of the module m8, i.e., 300, 400, and 10, respectively; the average toggle counts shown in FIG. 13, i.e., 200; the peak toggle counts as the maximum in the data shown in FIG. 13, i.e., 400; and the name of the primitive exhibiting the peak toggle counts, i.e., i1. FIG. 12 also shows the results of simulation made using test benches T2 and T3. In the case of using the test bench T2, the toggle counts of the input pins p20, p21, and p22 are 400, 300, and 10, the average toggle counts of the primitives is 400, the peak toggle counts is 800, and the primitive exhibiting the peak toggle counts are i1. In the case of using the test bench T3, the toggle counts of the input pins p20, p21, and p22 are 100, 100, and 100, the average toggle counts of the primitives are 100, the peak toggle counts are 100, and the primitives exhibiting the peak toggle counts are i1 and i2. Since the toggle varies depending on the test bench used, data of simulations made using a plurality of test benches is preferably prepared as the toggle analysis model.

Based on such a toggle analysis model for the VCs (modules), the toggles of the VCs (modules) for a circuit (block) (see FIG. 9) are extracted from the net toggle analysis information (see FIG. 6) for the circuit (block) including the VCs (modules). Taking the VC (module) m8 as an example, the nets connected to the inputs of the VC (module) m8 are the nets n9, n10, and n11 as shown in FIG. 8. Assume that these nets n9, n10, and n11 are connected to the input pins p20, p21, and p22, respectively. The toggle counts of the nets n9, n10, and n11 are 400, 300, and 10, respectively, from the table of FIG. 6. These toggle counts of the nets correspond to the values in the toggle analysis model for the VC (module) m8 obtained by the test bench T2 shown in FIG. 12. Accordingly, in FIG. 9, the average toggle counts Aact, the peak toggle counts Pact, and the peak toggle counts primitive are 400, 800, and i1, respectively, for the VC (module) m8. Note that although only the peak toggle counts primitive for the VC (module) m8 is shown in FIG. 9, those for the other VCs can also be obtained in the same manner.

When a toggle analysis model for a VC (module) as shown in FIG. 12 corresponding to the toggles of the nets is not stored in the VCDB 100, values can be obtained by interpolation using a general approximate expression for the input pin numbers, the average toggle counts, and the peak toggle counts stored in the VCDB 100.

From the toggle counts of the respective VCs, the average toggle counts and peak toggle counts of a block or a module are calculated. Hereinbelow, this calculation is described taking as an example the circuit constituted by the blocks B1, B2, B3, and B4 shown in FIG. 8. The toggle information for the VCs (modules) constituting each block is calculated based on the data shown in FIG. 9 in the following manner.

The average toggle counts AveAact(block) are calculated as the average of the average toggle counts of the modules in the block.

$$AveAact(B1) = \{Aact(m1) + Aact(m2) + Aact(m8) + Aact(m9)\}/4$$

$$= 550/4 \approx 137$$

The peak toggle counts PekPact(Block) are calculated as the maximum of the peak toggle counts of the modules in the block, together with the name of the module exhibiting the maximum peak.

PekPact(B1)=800, m8

FIG. 10 shows the data obtained by these calculations as a table.

Selection of Specific Block

From the above calculations, a specific block having many toggle counts are selected from the blocks. This can be done in any of the following three methods.

In the first method, the average toggle counts of the circuit (AveAact(CircuitB)=48) are calculated from the toggle counts of the blocks. Any block having average toggle counts higher than this value is selected as a specific block.

In the second method, the block exhibiting the maximum peak toggle counts obtained from the above calculation is selected as the specific block.

In the third method, any block that has average toggle counts AveAact(Block) distinctly greater than the other blocks is selected as a specific block. Also, any block that has peak toggle counts PekPact(Block) outstanding from the other blocks although the average toggle counts AveAact (Block) thereof are not so different from those of the other blocks is selected as a specific block.

Paralleling Processing for Dispersion of Toggle

Once a specific block is selected, it is subjected to paralleling processing. In this processing, the object to be processed is different between the case (1) where the specific block was selected based on the average toggle counts AveAact(Block) and the case (2) where the specific block was selected based on the peak toggle counts PekPact (Block).

In the case (1), the specific block is divided into parallel blocks. In the case (2), the module exhibiting the peak toggle counts in the specific block or the primitive exhibiting the peak toggle counts in the module is divided into parallel modules or primitives.

The number of divided parallel objects is determined so that the toggle counts of each of the resultant parallel objects is as close to the average of the toggle counts of other objects as possible.

The paralleling processing of dividing one block into two blocks has a disadvantage of increasing the entire circuit area (area damage). Therefore, a trade-off curve between the improvement in life profiting from this processing and the area damage as shown in FIG. 4(d) may be prepared, to determine an optimum point depending on the circuit type and the like. Likewise, it is also possible to prepare a trade-off curve between the area damage and the improvement in life profiting from reduction in performance.

Figure 11:
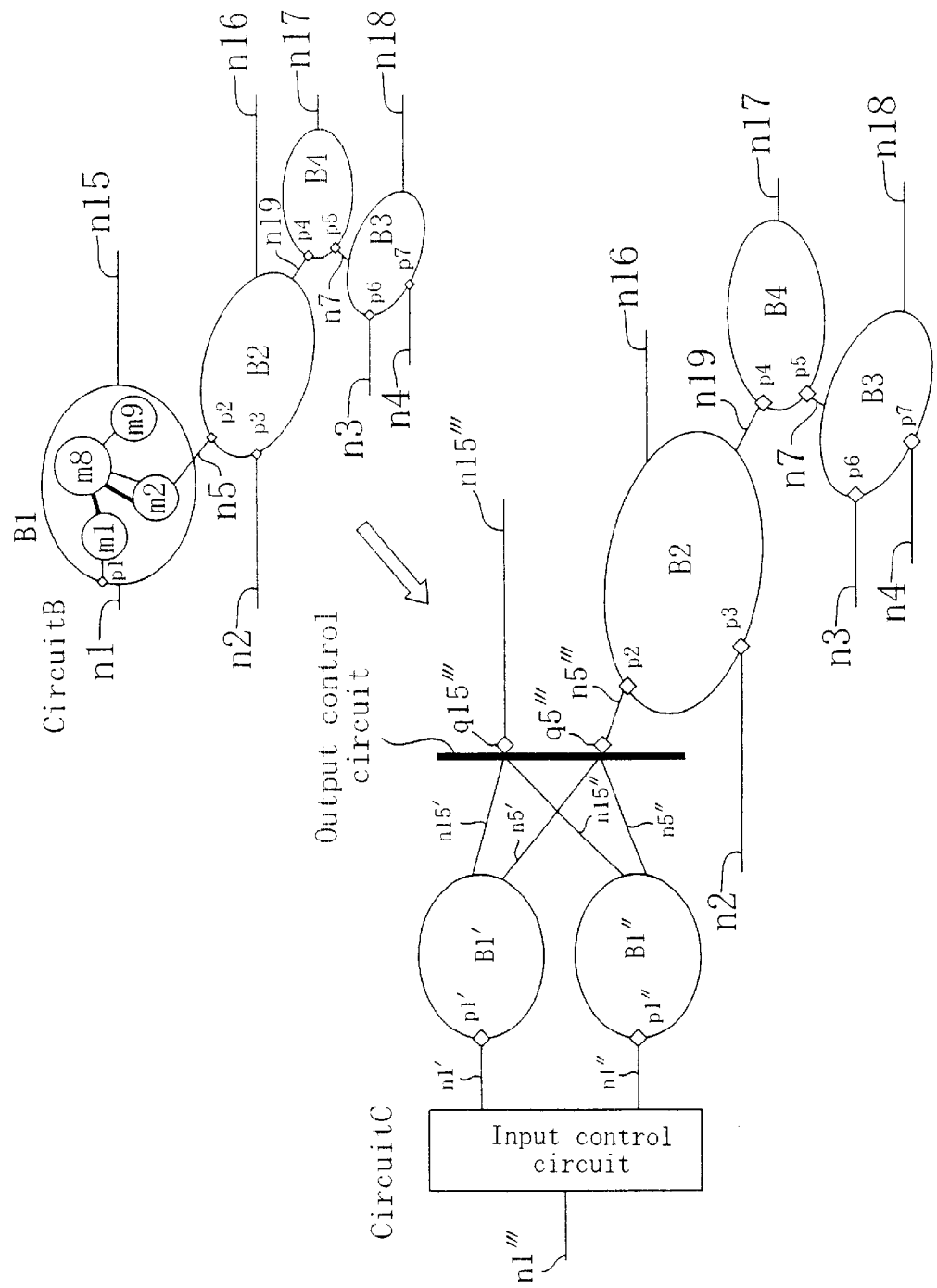
FIG. 11 is a block diagram illustrating paralleling processing where a block having many toggle counts is divided into two parallel blocks in EMBODIMENT 2 of the present invention.

FIG. 11 is a diagram illustrating paralleling processing where the block B1 as a specific block is divided into two parallel blocks B1' and B1".

Incorporation of Input Control Circuit and Output Control Circuit

For dispersion processing in the parallel objects (blocks B1' and B1"), an input control circuit and an output control circuit are incorporated. More specifically, the input side of the input control circuit is connected to a net n1'" and the output side thereof is connected to input pins p1' and p1" of the blocks B1' and B1" via nets n1' and n1", respectively. The input pins p1' and p1" have an equal function. The toggle counts of the input pins p1' and p1" of the blocks B1' and B1" are equalized in the following procedure.

First, on receipt of an input signal via a net n'", the input control circuit outputs the signal to the input pin p1' of the block B1' (or the input pin p1" of the block B1") by switch control.

The input control circuit then counts the toggle of the net n'". When the toggle reaches a predetermined number, the input control circuit switches the input signal received via the net n'" to be output to the input pin p1" of the other block B1" (or the input pin p1' of the block B1'). The predetermined number of the toggle counts can be determined in the following manner. From the results of simulation for the circuit shown in FIG. 10, the block B1 had average toggle counts of 88. The block B1 was divided into the two parallel circuits, blocks B1' and B1". Therefore, the toggle counts for switching is 88/2=44.

Thereafter, the switch timing of the input control circuit is continuously adjusted so that the difference in toggle counts between the input pins p1' and p1" is reduced, and finally determined when the toggle counts of the input pins p1' and p1" are substantially equal to each other.

The output control circuit is provided in the following manner.

The blocks B1' and B1" respectively have two output pins. One of the two output pins of the block B1' and one of the two output pins of the block B1" are connected to one of output pins of the output control circuit, i.e., an output pin q15'", via nets n15' and n15", respectively. Likewise, the other output pins of the blocks B1' and B1" are connected to the other output pin of the output control circuit, i.e., an output pin q5'", via nets n5' and n5", respectively. The output pin q15'" of the output control circuit is externally connected via a net n15'", while the output pin q5'"is connected to an input pin p2 of the block B2 via a net n5'".

The output control circuit may control the nets n15' and n15" connected to the output pin q15'" thereof in association with the control by the input control circuit. More specifically, the control may be done so that the output control circuit is connected to the net n15' when the input control circuit is connected to the net n1' and connected to the net n15" when the input control circuit is connected to the net n1". This is also applicable to the nets n5' and n5" connected to the output pin q5'".

It would be understood that the paralleling processing of a specific module (or a specific primitive) having particularly many toggle counts in a block can also be done merely by replacing the blocks B1' and B1" shown in FIG. 11 with modules (or primitives).

Thus, by the paralleling processing, the circuit behaivor of a specific block having particularly many toggle counts is dispersed. This minimizes local degradation and thus improves the life (reliability) of the integrated circuit device to be designed. cuit device to be designed.

The paralleling processing does not necessarily reduce power consumption directly. However, when a signal is transmitted via the two parallel blocks B1' and B1", the signal amount transmitted per unit time is the same as that transmitted via the single block B1 even if the transmission speed is made slower than in the case of transmission via the single block B1. In other words, the performace of the nets can be lowered. This reduces power consumption since power consumption W is roughly proportional to f·C·V² (where f denotes the operating frequency, C denotes the wiring capacitance, and V denotes the voltage).

The parallel processing of dividing one block into two blocks has a disadvantage of increasing the entire circuit area (area damage). Therefore, a trade-off curve between the improvement in life profiting from this processing and the area damage as shown in FIG. 4(d) may be prepared, to determine an optimum point depending on the circuit type and the like. Likewise, it is also possible to prepare a trade-off curve between the area damage and the improvement in life profiting from reduction in performance.

Embodiment 3

This embodiment is directed to the measures for reducing the internal toggle counts using equivalent pins. The measures includes two methods described below.

EXAMPLE 1

(Reduction of Toggle)

FIG. 12 shows in the form of a table the toggle counts of signals input into the input pins p20, p21, and p22 and the internal toggle counts of the module m8, for example, of which internal structure is shown in FIG. 14, among the modules having the data shown in FIG. 9. Specifically, this table shows: the test pattern for the test bench T1 where a signal having toggle counts of 300 is input into the input pin p20, a signal having toggle counts of 400 is input into the input pin p21, and a signal having toggle counts of 10 is input into the input pin p22; the test pattern for the test bench T2 where a signal having toggle counts of 400 is input into the input pin p20, a signal having toggle counts of 300 is input into the input pin p21, and a signal having toggle counts of 10 is input into the input pin p22; and the test pattern for the test bench T3 where signals having toggle counts of 100 are input into all of the input pins p20, p21, and p22.

Figure 15A:
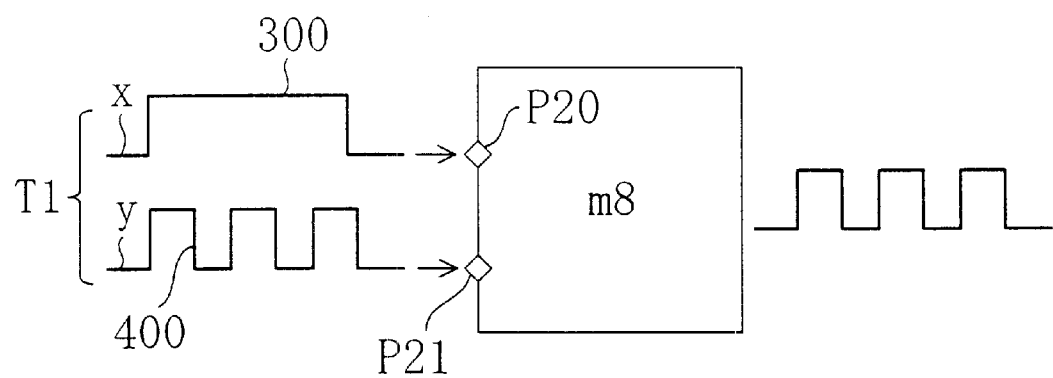
FIGS. 15(a) and 15(b) are block circuit diagrams illustrating two cases where input signals into two input pins of the module shown in FIG. 12 are exchanged, shown to compare the difference in internal toggle counts by this exchange.
Figure 15B:
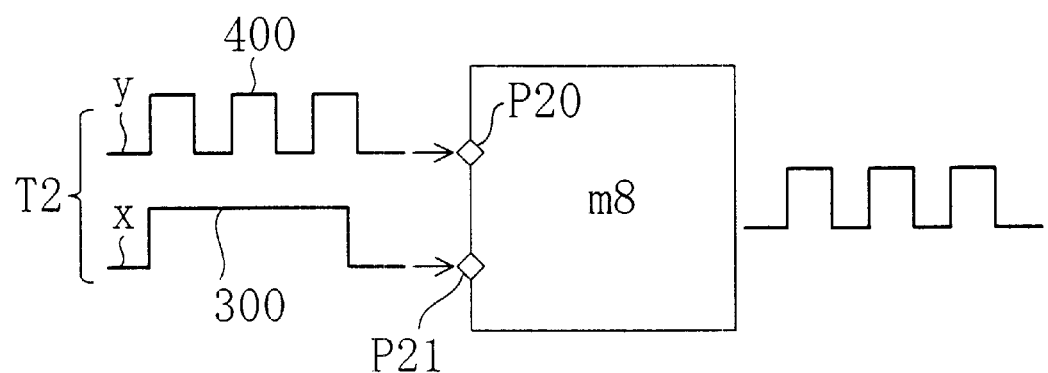

In this embodiment, it is assumed that the input pins p20 and p21 are equivalent pins to each other. The "equivalent pin" as used herein refers to the case as follows. That is, the output signal from the module m8 is the same irrespective of whether two signals x and y are input into the input pins p20 and p21 of the module m8, respectively, as shown in FIG. 15(a) illustrating an example of the test pattern for the test bench T1, or two signals x and y are input into the input pins p21 and p20 of the module m8, respectively, as shown in FIG. 15(b) illustrating an example of the test pattern for the test bench T2.

Although the output signal is the same, there is a case where the internal average toggle counts are different. In the illustrated example of the module m8, the internal average toggle counts are 200 in the case shown in FIG. 15(a) while it is 400 in the case shown in FIG. 15(b). This occurs when the internal construction of the object (in this example, the module m8) is asymmetric, such as the case shown in FIG. 14 where the primitive i1 is a multiplier. In such an occasion, a signal input method serving to reduce the internal toggle counts are selected. In the illustrated example, the connection of the nets is changed so that the signal input method shown in FIG. 15(a) is selected.

Thus, when the object has two or more equivalent pins and the internal construction of the object is asymmetric, the internal toggle counts of the object may change in some cases by exchanging signals input into the equivalent pins. In such cases, the signal input method resulting in the lowest internal toggle counts may be selected. This contributes to fabrication of an integrated circuit device with minimized reduction in reliability caused by local degradation.

In order to implement the above function, it is necessary to add to the toggle analysis model as shown in FIG. 12 such information that the input pins p20 and p21 are equivalent pins and that a net having less toggle counts should be connected to the input pin p20. In such a case, the information on the test bench T2 of "400, 300, 10, 400, 800, i1" is no more necessary.

EXAMPLE 2

(Equalization of Toggle Counts)

Figure 16A:
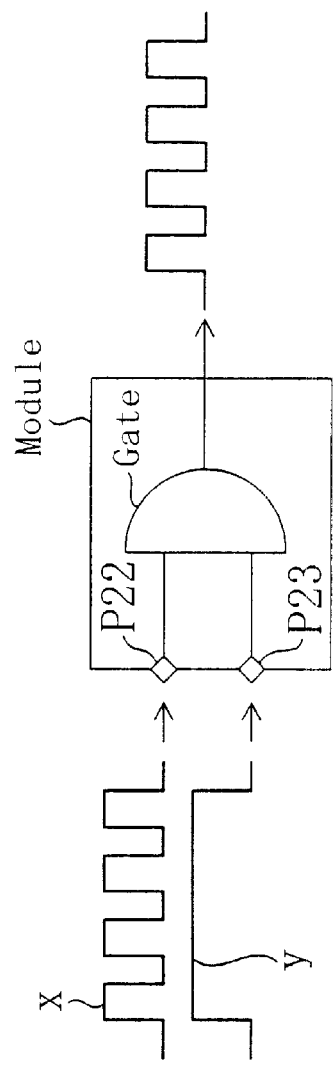
FIGS. 16(a) and 16(b) are block circuit diagrams illustrating toggle counts equalizing processing in the second example of EMBODIMENT 3 of the present invention.
Figure 16B:
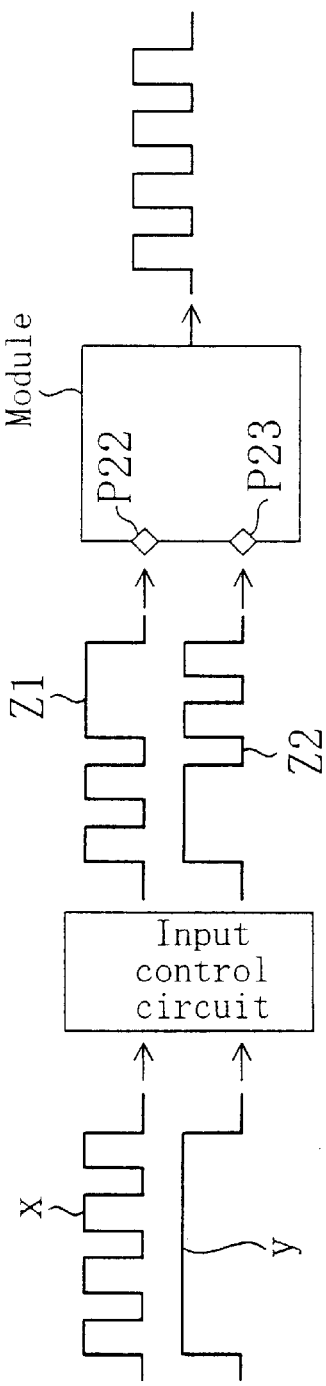

FIGS. 16(a) and 16(b) are block circuit diagrams illustrating toggle count equalization in this example. Referring to FIG. 16(a), when signals x and y are input into input p22 and p23 that are equivalent pins of a module having a symmetric internal construction, the toggle counts of the input pins p22 and p23 are deviated from each other. This causes local degradation in the region associated with the input pin p22 having more toggle counts.

In order to solve the above problem, as shown in FIG. 16(b), an input control circuit is placed upstream of the module, which partially exchanges the input signals x and y with each other to generate modified signals z1 and z2 having substantially equal toggle counts. After this modification of the input signal patterns, the output signal from the module is the same as that shown in FIG. 16(a).

Thus, in this example, when the internal construction of the object is symmetric but the transition of signals input into equivalent pins is deviated from each other, the transition of the signals is equalized. This contributes to fabrication of an integrated circuit device with minimized reduction in reliability caused by local degradation.

In order to implement the above function, it is necessary to add to the toggle analysis model as shown in FIG. 12 such information that the input pins p20 and p21 are equivalent pins and that the internal toggle counts do not change due to the deviation of the toggle counts of the equivalent pins.

Embodiment 4

This embodiment is directed to the measures for equalizing the toggle counts of net wiring by a net wiring method.

Figures 17, 18:
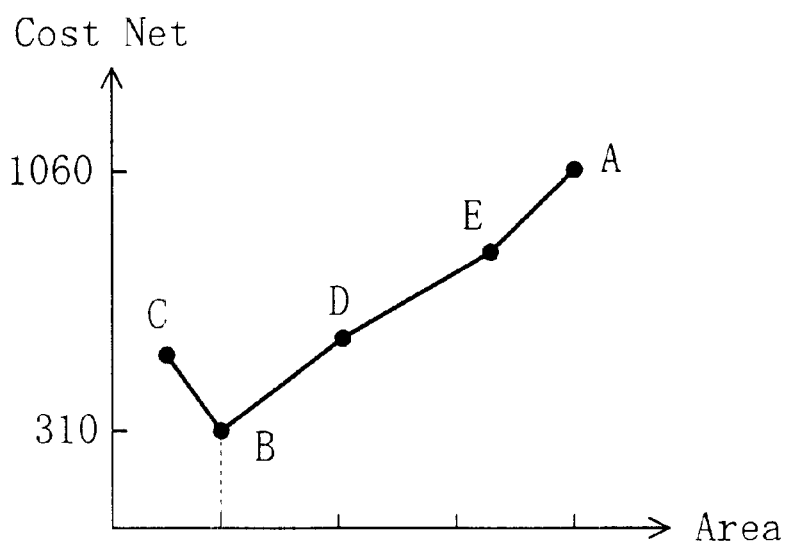
FIG. 17 shows in the form of a table the toggles of specific nets excerpted from FIG. 6 together with objects connected via the nets in EMBODIMENT 4 of the present invention.
FIG. 18 is a graph showing the trade-off relationship between the cost function Cost Net and the circuit area observed when the module placement is changed in EMBODIMENT 4 of the present invention.

FIG. 17 shows in the form of a table the toggle counts of specific nets such as nets n9, n10, and n1, extracted from the table of FIG. 6, together with the objects (modules in this example) connected via the nets. As described above, the cost function Cost Net can be obtained as shown in FIG. 7 for various net arrangements A, B, C, D, . . . such as the circuits A and B shown in FIG. 6.

In the case shown in FIG. 17 where the toggle counts of the nets n9 and n10 are extremely high, priority is given to the two objects to be connected via these nets having many toggle counts in the floor plan.

By the above priority connection, a net having many toggle counts is arranged so that the length thereof is small, while the length of a net having a few toggle counts is made large. In this way, the toggle counts of the nets are equalized. This contributes to fabrication of an integrated circuit device with reduced local degradation and high reliability.

By the above equalization of the toggle counts with priority, there may arise a case of violating a delay restriction. In such a case, an intermediate buffer may be placed in the net to satisfy the delay restriction. The placement of the intermediate buffer however increases the circuit area.

In order to solve the above problem, a graph showing the trade-off relationship between the cost function Cost Net and the circuit area for various module arrangements as shown in FIG. 18 may be prepared, to permit optimum selection depending on the type of the integrated circuit device and the like in the floor plan.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A method for designing an integrated circuit device comprising the steps of:
   (a) generating a plurality of sub-circuits each including a plurality of components placed therein;
   (b) generating first nets for connecting the components placed in a common one of the sub-circuits in the step (a) and second nets for connecting the components placed in different ones of the sub-circuits in the step (a);
   (c) analyzing the toggles of the first nets and the second nets generated in the step (b) by simulating the operations of the components; and
   (d) changing the placement of the components and the connection relationship between the components and the nets based on the analysis results obtained from the step (c) so as to reduce the entire toggle counts of the first and second nets.

2. The method of claim 1, wherein the step (d) comprises placing two components in a common one of the sub-circuits, the two components are connected via one of the second nets of which toggle counts are more than a value obtained by multiplying an average of the toggle counts of all the nets by a given multiplier.

3. A method for designing an integrated circuit device comprising the steps of:
   (a) generating a plurality of sub-circuits each including a plurality of components placed therein;
   (b) generating first nets for connecting components placed in a common one of the sub-circuits generated in the step (a) and second nets for connecting components placed in different ones of the sub-circuits generated by the step (a);
   (c) analyzing the toggles of the components in the sub-circuits generated in the step (a) by simulating the behaivors of the components; and
   (d) changing the placement of the sub-circuits and the components based on the analysis results obtained from the step (c) so as to equalize the toggle counts of all the components.

4. The method of claim 3, wherein the step (d) comprises paralleling processing where a sub-circuit out of the plurality of sub-circuits of which toggle counts are equal to or more than a given value is divided into a plurality of parallel sub-circuits.

5. The method of claim 4, wherein the paralleling processing is performed so that the increase rate of the area of the integrated circuit device after the paralleling processing does not exceed a given range.

6. The method of claim 4, further comprising the step of simulating behaviors of components in the plurality of parallel sub-circuits generated in the step (d) and placing an input control circuit upstream of the plurality of parallel sub-circuits for switching the supply of a signal to the parallel sub-circuits so that the toggle counts of the parallel sub-circuits are equalized.

7. The method of claim 6, further comprising the step of simulating behaviors of components in the plurality of parallel sub-circuits generated in the step (d) and placing an output control circuit downstream of the plurality of parallel sub-circuits for collecting output signals from the parallel sub-circuits to output an output signal.

8. A method for designing an integrated circuit device comprising the steps of:
   (a) placing a plurality of components;
   (b) connecting the components placed in the step (a) via nets;
   (c) analyzing the toggles of the components placed in the step (a) by simulating the behaviors of the components; and
   (d) when it is found from the results of the analysis in the step (c) that there exists a component having the same number of input pins as the number of input signals received by the input pins and the input signals can be exchanged between the input pins without changing an output signal although the toggle counts of the component changes, changing the nets so that the input relationship providing less toggle counts is established.

9. A method for designing an integrated circuit device comprising the steps of:
   (a) placing a plurality of components;
   (b) connecting the components placed in the step (a) via nets;
   (c) analyzing the toggles of the components placed in the step (a) by simulating the behaviors of the components; and
   (d) when it is found from the results of the analysis in the step (c) that there exists a symmetric component having the same number of input pins as the number of input signals received by the input pins and the input signals can be exchanged between the input pins without changing an output signal although the toggles of the input pins are different, placing an input control circuit for equalizing the toggles of the input pins upstream of the symmetric component.

10. A method for designing an integrated circuit device comprising the steps of:
    (a) placing a plurality of components;
    (b) connecting the components placed in the step (a) via nets;
    (c) analyzing the toggles of the components placed in the step (a) by simulating the behaviors of the components; and
    (d) preparing a floor plan based on the results of the analysis in the step (c) so that two components connected via a net having a high toggle count relative to the other nets are placed closer to each other.

11. The method of claim 10, wherein the floor plan in the step (d) is prepared so that the area of the integrated circuit device does not exceed a given range.

* * * * *